(12) United States Patent
Eriksson et al.

(10) Patent No.: US 11,377,745 B2
(45) Date of Patent: Jul. 5, 2022

(54) STRIPPING OF COATINGS AL-CONTAINING COATINGS

(71) Applicant: Oerlikon Surface Solutions AG, Pfäffikon, Pfäffikon (CH)

(72) Inventors: Anders Olof Eriksson, Chur (CH); Sebastian Benedikt, Feldkirch (AT); Vadim Schott, Bingen (DE)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 17/270,337

(22) PCT Filed: Aug. 21, 2019

(86) PCT No.: PCT/EP2019/072411
§ 371 (c)(1),
(2) Date: Feb. 22, 2021

(87) PCT Pub. No.: WO2020/039011
PCT Pub. Date: Feb. 27, 2020

(65) Prior Publication Data
US 2021/0324524 A1 Oct. 21, 2021

Related U.S. Application Data

(60) Provisional application No. 62/720,519, filed on Aug. 21, 2018.

(51) Int. Cl.
*C23F 1/36* (2006.01)
*C23F 1/44* (2006.01)

(52) U.S. Cl.
CPC . *C23F 1/36* (2013.01); *C23F 1/44* (2013.01)

(58) Field of Classification Search
None
See application file for complete search history.

(56) References Cited

U.S. PATENT DOCUMENTS

| | | |
|---|---|---|
| 4,965,095 A | 10/1990 | Baldi |
| 9,057,134 B2 | 6/2015 | Andreoli et al. |
| 9,879,356 B2 | 1/2018 | Wittel et al. |
| 2005/0161439 A1* | 7/2005 | Wustman ............ F01D 5/005 216/103 |
| 2009/0229636 A1* | 9/2009 | Fairbourn ............ C25F 7/00 134/18 |
| 2011/0256807 A1* | 10/2011 | Feng ............ C25F 1/00 451/28 |

FOREIGN PATENT DOCUMENTS

| | | |
|---|---|---|
| EP | 1437425 A1 | 7/2004 |
| EP | 2558621 A2 | 2/2013 |

* cited by examiner

*Primary Examiner* — Allan W. Olsen

(57) ABSTRACT

Method for stripping a coating from a coated surface of a substrate, wherein the coating is stripped in an aqueous alkaline solution, characterized in that the method comprises following steps:—preparing the coated substrate to be decoated by providing the substrate with a strippable coating by depositing a coating comprising one or more layers, wherein one layer comprising aluminum is deposited directly on the substrate surface to be decoated and—introducting the substrate to be decoated in the aqueous alkaline solution, thereby conducting a chemical stripping of the coating from the substrate, whereas the aqueous alkaline solution comprises NaOH in a concentration in weight percentage from 30 wt. % to 50 wt. %.

9 Claims, 4 Drawing Sheets

STRIPPING OF COATINGS AL-CONTAINING COATINGS

Figure 1:
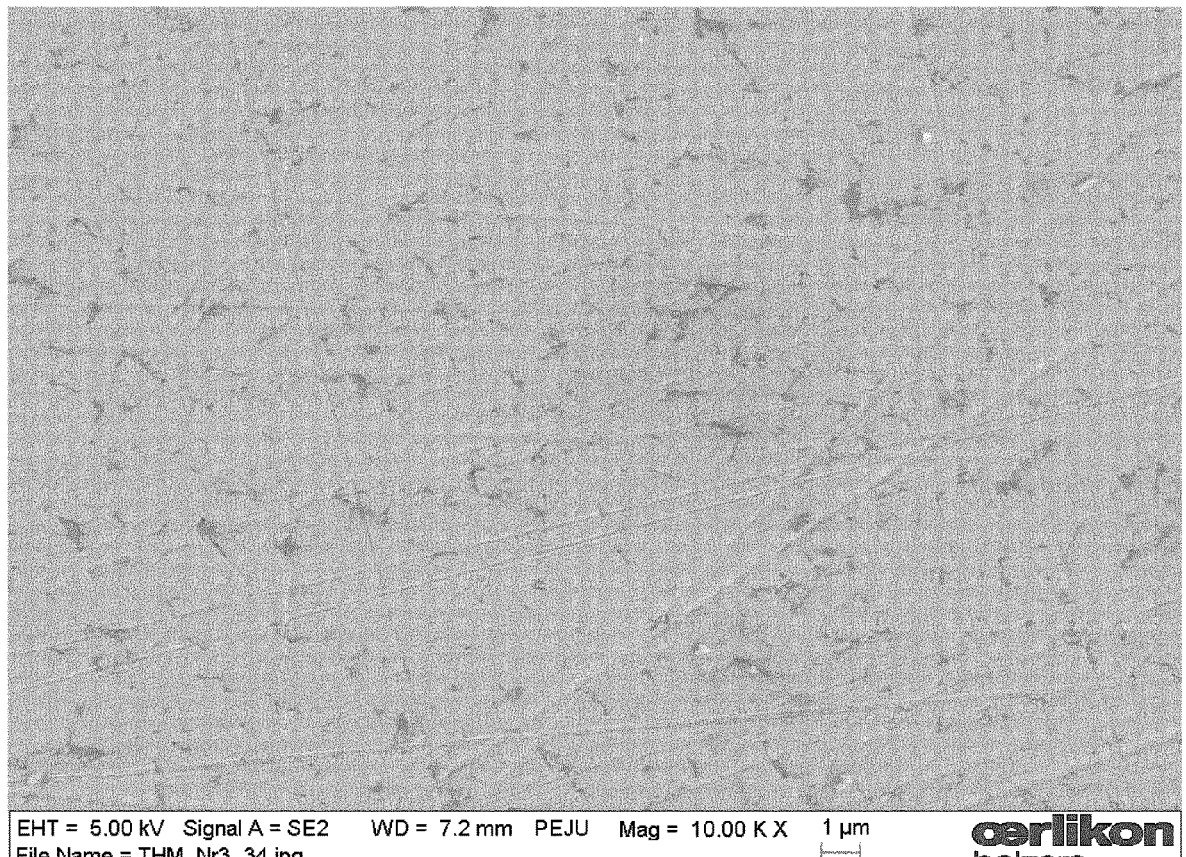

The present invention relates to a method for stripping of coatings from a substrate surface, wherein the coating contains aluminum (Al). In particular, the inventive method is useful for stripping of coatings containing AlCrN (aluminum chromium nitride), more in particular for stripping of coatings containing at least one layer comprising AlCrN (aluminum chromium nitride) or consisting of AlCrN.

STATE OF THE ART

Andreoli et al describe a process for wet-chemical stripping (hereafter also referred to as wet-chemical delaminating) of coated substrates in the U.S. patent application Ser. No. 12/989,727. They recommend using an aqueous, alkaline solution for dissolving the coating from the substrate by introducing the coated substrate in the aqueous, alkaline solution. They recommend using a chemical solution containing between 3 and 8 weight percent of $KMnO_4$ and having at the same time an alkaline fraction of between 6 and 15 weight percent, wherein the alkaline fraction is preferably formed by KOH or NaOH, and wherein the pH of the solution is above 13. They propose furthermore using this solution for wet-chemical delaminating of coatings of one of the following types: metallic AlCr, TiAlCr, other AlCr alloys; nitrides, carbides, borides or oxides thereof; and combinations thereof.

However, the disadvantage of using oxidation agents, such as $KMnO_4$, is that not only the coating but also the substrate is attacked by the chemical solution. Therefore, the decoated substrate surface (after stripping) often need a mechanical treatment, such as microblasting or polishing in order to have an appropriate substrate surface after the stripping process that can be successful used for re-applying a coating (hereafter also referred to as re-coating).

If the coated substrate is left a long time in the stripping solution, the substrate will be partly dissolved in the surface substrate area. This can lead to form changes that can be critical for different tools or components that are intended to be re-utilized. For example, cutting tools can come out of precision because of dissolution of parts of the surface of the tool.

Therefore, using such oxidation agents, the stripping time need to be carefully controlled so that the stripping time is long enough for ensuring that the coating is completely dissolved but at the same time the stripping time is short enough for avoiding big damages of the substrate surface. The longer time the substrate remains in the chemical solution the higher is the damage caused to the substrate.

In particular, substrates (tools or components) coated having differences in coating thickness along the coated surface, for example due to geometrical shading in PVD-coating processes, constitute a big challenge.

The stripping time need to be long enough that the thickest coated areas are stripped, which, however, increases the substrate attack at areas that have thinner coating and are therefore stripped at shorter time.

A further disadvantage with methods using oxidation agents is that these methods are non-selective stripping methods, it means that the non-coated surfaces of the substrates to be decoated must be shielded with any material that impedes the chemical attack to these non-coated surfaces of the substrate.

For example, a cover of polymeric material must be used for masking the non-coated areas before exposure to the chemical stripping solution. This applies also to parts of the substrates that should not be attacked, such as inscriptions or markings. The process of applying and removing maskings or shieldings adds additional working steps, can be time-consuming and increment costs.

OBJECTIVE OF THE PRESENT INVENTION

An objective of the present invention is to provide a decoating solution that allows overcoming at least some of the above-mentioned deficiencies of non-selective stripping methods, in particular such methods that involve wet-chemical stripping by using aqueous solutions containing oxidating agents such as $KMnO_4$.

DESCRIPTION OF THE PRESENT INVENTION

The objective of the present invention is attained by performing the method for stripping a coating from a coated surface of a substrate according to the main claim.

The inventive method comprises the following steps:

As a first step, which may take place long before the second step, a strippable substrate is manufactured by depositing a coating comprising aluminum directly on the substrate surface to be stripped. The substrate surface to be stripped is the surface of the substrate that becomes "decoated" or "naked" by stripping and that should not be attacked by stripping. On top of this coating additional coatings may be deposited or not.

Later on, as soon as the time of stripping has come, the substrate to be stripped is introduced, that means flushed by means of or preferably immersed into an aqueous alkaline solution. The aqueous solution effects a chemical stripping of the coating from the substrate.

According to the invention the aqueous alkaline solution comprises NaOH in a concentration in weight percentage from 30 wt. % to 50 wt. %. Preferably the concentration range includes the border values 30 wt. % NaOH and 50 wt. % NaOH, respectively.

The inventors have found and for first time systematically used the effect that the aluminum comprised by the layer deposited directly on the surface to be stripped forms a kind of "predetermined breaking point". This breaking point fails under the attack of NaOH. In this way the layer deposited directly on the said surface can be stripped speedily.

Preferably the aluminum comprising layer deposited directly on the substrate surface to be stripped is:
- a metallic interlayer layer, or
- a wurtzite aluminum nitride layer (can be also deposited as interlayer), or
- a layer (can be also deposited as interlayer) comprising wurtzite aluminum nitride, or
- an aluminum oxide layer (can be also deposited as interlayer).

Preferably the chemical stripping is conducted by maintaining the aqueous alkaline solution at a temperature corresponding to a value in a range from 80° C. to 160° C., the temperature range including the border values 80° C. and 160° C., respectively.

According to a preferred embodiment of a method according to the present invention, the layer deposited directly on the substrate surface is deposited by using a physical vapor deposition (PVD) process and before conducting the deposition process, a blasting media comprising alumina is used for blasting (also called sandblasting in the context of the present invention) one or more cathodes that are used as coating material source for depositing said layer deposited directly on the substrate. These one or more blasted cathodes create different deposition conditions during the first stage of the PVD deposition process, resulting in formation of a thin first coating layer (or a kind of interlayer), which facilitates chemical stripping of the coating with the aqueous alkaline NaOH solution (in general the formation of the mentioned kind of interlayer in this manner do not causes deterioration of coating performance). The inventors think that in this case, one possible explanation of this effect is that blasting media firstly cleans the surface of the cathode (e.g. removes cathode material that has reacted with a reactive gas, such as nitrogen or oxygen) and afterwards may be soaks into the target surface in such a manner that the formation of a first layer or interlayer produced by used the blasted cathode is influenced by the soaked blasting media in the cathode surface, resulting in this positive effect (resulting in formation of a first layer or interlayer that facilitates chemical stripping with the aqueous alkaline NaOH solution).

Taking into according the above aspect of the present invention, one preferred embodiment of the present invention is a method for stripping a coating from a surface of a substrate comprises following steps:

a) using a blasting media comprising alumina for blasting a cathode that will be used as coating material source for depositing at least a first coating layer of the coating, which is deposited on the substrate surface by using a physical vapor deposition (PVD) process, b) activating the cathode for depositing the first coating layer after blasting of the cathode as indicates in step a), c) depositing the first coating layer, wherein during the deposition of the first coating layer an interlayer is formed directly on the substrate surface, wherein said interlayer can comprise alumina coming from the blasting media used in step a), d) chemical stripping of the coating from the substrate, wherein the substrate with the coating introduced in an aqueous solution comprising NaOH (with aqueous solution properties during chemical stripping as explained below).

According to a preferred embodiment of the present invention the concentration of NaOH in the aqueous alkaline solution is a value in a concentration range from 40 wt. % to 50 wt. %, including the border values 40 wt. % and 50 wt. %, respectively. More than 50° wt. % of NaOH in the solution can result in a saturation of the solution and consequently in precipitation of solid NaOH what is not positive for the process. Less than 30 wt. % of NaOH in the solution can result in an inefficient stripping process.

Preferably the temperature of the aqueous alkaline solution is selected to be in a range from 100° C. to 140° C., the range including the border values 100° C. and 140° C., respectively.

The first layer of interlayer deposited directly on the substrate surface to be coated and subsequently (e.g. after use) decoated in the context of the present invention should be deposited preferably having a layer thickness of at least 5 nm, more preferably of at least 8 nm or 10 nm. The Al content in this first layer or interlayer should be preferably not lower than 30 at. %, more preferably not lower than 35 at. %.

According to an optional preferred embodiment of the present invention, the method includes a step to be conducted before introducing the coated substrate in the aqueous solution, in this additional step, the coated substrate is introduced in an acidic solution for weakening of the coating in a kinetically controlled reaction using acids and/or oxidizing agents. In this embodiment, it would be necessary shielding all non-coated substrate surfaces that are intending to be in contact with the acidic solution for impeding chemical attack to these non-coated surfaces of the substrate. Preferably the acidic solution is:

a mixture comprising $HNO_3$ or consists of $HNO_3$, or
a mixture comprising $H_2SO_4$ or consists of $H_2SO_4$, or
a mixture comprising HCl or consists of HCl.

The inventors have found that a suitable time of exposition i.e. reaction time in the acidic solution correspond to a value in a range from 1 min to 10 min, the reaction time range including the border values 2 min and 10 min, respectively.

Sandblasting of the cathodes as mentioned above have resulted in formation of a metallic/partially metallic interlayer (in many cases with thickness of about 10 nm) between the substrate and the coating, which favors the coating be dissolved without damage of the substrate surface, in particular very good results were observed by using NaOH-water 50-50 wt. % solution at 140° C.

Replacing sandblasting of the cathodes by using other methods having similar effects can be possible. The inventors consider that the cause of the better solubility of the coatings produced by using cathodes which were previously sandblasted can be the content of metallic Al in the interface.

May be producing a metallic interlayer or using cathodes with higher content of Al (e.g. higher than 70 at % Al) for producing the first layer (e.g. the interlayer) could also result in improved solubility.

This invention relates to a decoating process (also referred to as stripping process) without using oxidating agents. Thereby, the inventive process is selective because attack only the coating and not the substrate.

The stripping time is therefore not critical in comparison with wet-chemical stripping processes using $KMnO_4$ as oxidizing agent, because by using the inventive method the substrates suffer no damage if they are left in the stripping solution even after the decoating (dissolution or removing of the coating) is completed. See examples in FIGS. 1-3. Substrates with complexes geometries such as different tools and components having coatings with different variable coating thickness along the extension of the coated area can be handled easily, and there is no need for masking before decoating process or mechanical treatment of the decoated substrate surface before recoating.

A further aspect of the present invention is related to avoiding cobalt leaching (hereafter also referred to as Co-leaching.

It is well known that if cemented carbide materials and consequently substrates made of cemented carbide or comprising cemented carbide are for a long time immersed in an aqueous solution, dissolution of the cobalt binder phase can occur. This effect is known as Co-leaching. To prevent Co-leaching while cemented carbide substrates are undergoing chemical stripping according to the present innovation, coated cemented carbide substrates can be hold by using a substrate holder equipped with a sacrificial anode having a lower electrochemical potential than cobalt.

For example, a sacrificial anode containing Fe ($E^0$-0.447V for the oxidation to $Fe^{2+}$) would be useful for preventing Co to dissolve ($E^0$-0.28V for the oxidation to $Co^{2+}$). See illustration in FIG. 4.

Therefore, according to a preferred embodiment of the present invention, the inventive method comprises the use of a sacrificial anode connected to the substrate to be decoated for conducting the chemical stripping process without producing any dissolution of cobalt binder in cases in which the substrate is made of cemented carbide material or comprises cemented carbide material, wherein the material of the sacrificial anode is selected having lower electrochemical potential than the material of the substrate to be decoated, or having lower electrochemical potential than the material constituents contained in the substrate to be decoated that can be dissolved during chemical stripping. For example, the material of the sacrificial anode for decoating substrate materials such as cemented carbide having a cobalt binder phase, can be selected having lower electrochemical potential than cobalt. Then in the case of using cemented carbide substrates having a cobalt binder phase, the sacrificial anode can be made of iron or of a material comprising largely iron.

Further aspects of the invention will be illustrated and explained in more detail for improving understanding of the present invention. Following figures should help to illustrate and understand the present invention.

Figure captions:

FIG. 1: Scanning electron micrograph (SEM) of the surface of polished cemented carbide substrate, WC with 6 wt. % Co, prior to applying coating.

Figure 2:
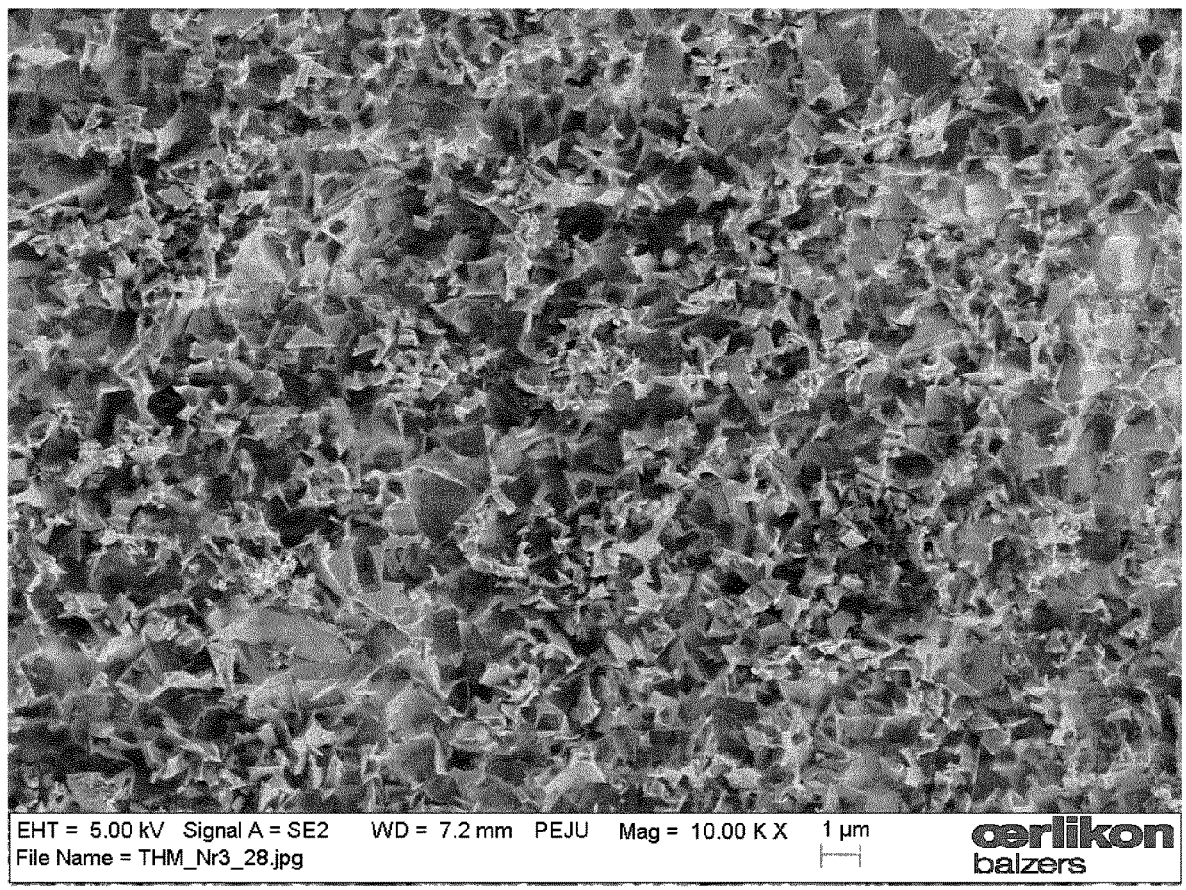

FIG. 2: Scanning electron micrograph (SEM) of the surface of polished cemented carbide substrate, after 10 minutes immersion in stripping media according to state of the art: 4 wt. % KMnO4, 8 wt. % NaOH. The surface is strongly attacked, WC grains are dissolved, Co-matrix is remained.

Figure 3:
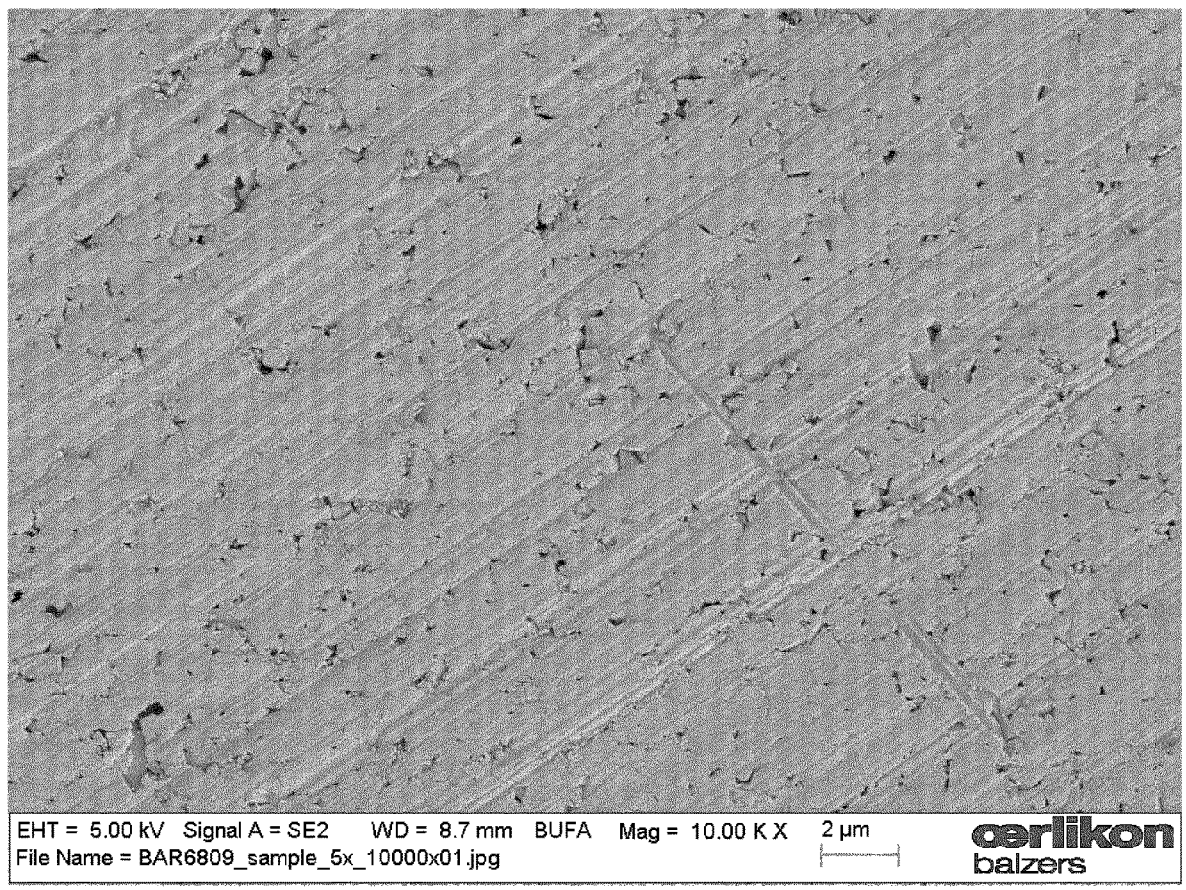

FIG. 3: Scanning electron micrograph (SEM) of the surface of polished cemented carbide substrate, after 5 hours immersion in stripping media according to the present invention: 50 wt. % NaOH at 140° C. The substrate surface is intact.

Figure 4:
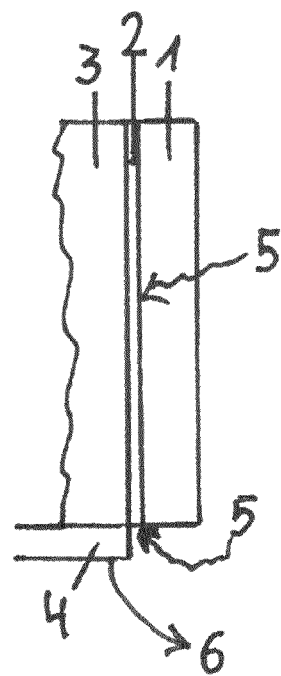

FIG. 4: Schematic drawing of the stripping process construction including sacrificial anode. 1: AlCrN coating, 2: Interlayer, 3: WC/Co-substrate (cemented carbide substrate), 4: sacrificial anode made of iron having electrical connection with the substrate to be decoated according to the present invention, 5: Stripping solution comprising NaOH according to the present invention, 6: Oxidation layer formed of iron oxide produced by oxidation of the sacrificial anode.

In order to explain the present invention in more detail, some examples will be described. The described inventive examples should not be understood as a limitation of the invention but only as showcases of possible and for most cases preferred embodiments of the invention.

Example 1 Comparative Example

Stripping Process According to State of the Art

State of the art PVD coatings, in particular AlCrN deposited from targets with composition $Al_{70}Cr_{30}$ in atomic percentage, are stripped using a solution of 4 wt. % $KMnO_4$ and 8 wt. % NaOH. The coated substrates are left in the stripping solution for 20 minutes until complete dissolution of the coating. The substrate surface is attacked and consequently looks after decoating process strongly damaged and rough.

Example 2 Inventive Example

An inventive process was conducted comprising following steps:

I) Coating preparation step—before the PVD coating procedure, the surface of AlCr-targets with composition $Al_{70}Cr_{30}$ in atomic percentage, which were used in the PVD process step were treated previously by sandblasting. The sandblasting media consists of $Al_2O_3$ of grit size 0.25-0.5 mm. Blasting pressure of 1-5 bars, typically 4 bars was used, and the basting time was about up to 30 seconds to cover the surface are of one target.

II) Application of a PVD coating of AlCrN using the deposition targets prepared in step I. $N_2$ is used as process gas.

III) Chemical stripping of the coating by introducing the coated substrates in a 50 wt % NaOH solution at 130° C. After 4 hours, the coating (3 μm) was completely removed from the substrates. The substrates did not show any damage or degradation of the substrate surface.

Example 3 Inventive Example

One more inventive process was conducted comprising following steps: I) At the beginning of the coating process, a metallic interlayer was deposited by using PVD techniques, wherein the metallic interlayer was deposited directly on the substrates by using Al70Cr30-targets as coating material source and Ar gas flow as process gas in the coating chamber, typically 300 sccm for 20 s up to 5 min. The thickness of the metallic interlayer ranged between 20 nm to 460 nm.

II) A coating layer of AlCrN was deposited on the metallic interlayer by using $N_2$ gas flow as process gas (in this case also called reactive gas because of the reaction with AlCr material from the targets of composition Al70Cr30) for forming an AlCrN coating layer on the interlayer deposited on the substrates being coated.

III) Chemical stripping of the coating by introducing the coated substrates in a 50 wt % NaOH solution at 130° C. After 1.5 hours, the coating was completely removed from the substrates. The substrates did not show any damage or degradation of the substrate surface.

Example 4 Inventive Example

One more inventive process was conducted comprising following steps:

I) At the beginning of the coating process, an interlayer containing wurtzite-AlN was deposited by using PVD techniques from AlCr targets having element composition Al90Cr10 in atomic percentage, which were used as coating material source in a coating chamber comprising $N_2$ gas flow as process gas (in this case also called reactive gas because of the reaction with AlCr material from the targets) for forming AlCrN coating layers containing wurtzite-AlN.

II) A coating layer of AlCrN was deposited on the interlayer containing wurtzite-AlN by using PVD techniques from AlCr targets having element composition Al70Cr30 in atomic percentage, which were used as coating material source in a coating chamber comprising $N_2$ gas flow as process gas for forming an AlCrN coating layer on the interlayer deposited on the substrates being coated.

III) Chemical stripping of the coating by introducing the coated substrates in a 50 wt % NaOH solution at 130° C. After 1.5 hours, the coating was completely removed from the substrates. The substrates did not show any damage or degradation of the substrate surface.

Example 5 Inventive Example

One more inventive process was conducted comprising following steps:

I) At the beginning of the coating process, a metallic interlayer was deposited by using PVD techniques, wherein the metallic interlayer was deposited directly on the substrates by using AlCr-targets of composition Al70Cr30 in atomic percentage as coating material source and Ar gas flow as process gas in the coating chamber as described in Example 3.

II) A coating layer of AlCrN was deposited on the metallic interlayer by using $N_2$ gas flow as process gas (in this case also called reactive gas because of the reaction with AlCr material from the targets—same targets as used in step I) for forming an AlCrN coating layer on the interlayer deposited on the substrates being coated.

III) Exposing the samples to an acid ($HNO_3$, $H_2SO_4$, HCl) for a kinetically controlled reaction. In particular, one sample (substrate coated as indicated in previous steps I and II) was exposed to HCl for 2 minutes. Another sample (also a substrate coated as indicated in previous steps I and II) was exposed to $H_2SO_4$ for 2 minutes.

IV) Chemical stripping of the coating by introducing the coated substrates in a 50 wt % NaOH solution at temperature of 90° C. (40° C. lower compared to Example 3). After 3 hours, the coating was completely removed from both substrates.

Examples 6, 7, 8, 9 and 10

These examples have all the same steps I and II as described below but differentiate each one from each other in the conduction of the chemical stripping process, i.e. in following step III:

I) Before initiating coating step, the surface of AlCr-targets to be used afterwards in the deposition were treated by sandblasting. The sandblasting media consisting of $Al_2O_3$ of grit size 0.25-0.5 mm. Blasting pressure of 1-5 bars, typically 3 bars was used, and the blasting time was about up to 30 seconds to cover the surface are of one target.

II) Conducting coating process, wherein a coating layer of AlCrN was deposited on the substrate surface to be coated by using PVD techniques from AlCr targets having element composition Al70Cr30 in atomic percentage, which were used as coating material source in a coating chamber comprising $N_2$ gas flow as process gas for forming an AlCrN coating layer on the substrates being coated III) 6 different samples (substrates coated by following the steps I and II as described directly above) undergo chemical stripping of the coating as following:

Step III of Example 6

IIIc. LiOH was used as base in a saturated aqueous solution having LiOH concentration of 13 wt. %. Partial stripping was observed after 1 h, slower stripping rate compared to chemical stripping processes in which a NaOH 50 wt. % concentration was used.

Step III of Example 7

IIIb. KOH was used as saturated aqueous solution having KOH concentration of 50 wt. %. Partial stripping was observed after 1.5 h, slower stripping rate compared to compared to chemical stripping processes in which a NaOH 50 wt. % concentration was used.

Step III of Example 8

IIIc CsOH was used in an aqueous solution having CsOH concentration of 75 wt. %. Partial stripping was observed after 3 h, slower stripping rate compared to compared to chemical stripping processes in which a NaOH 50 wt. % concentration was used.

Step III of Example 9

IIId. Base/salt mixture of NaOH:KOH in molar rate 1:1 was used in a saturated an aqueous solution having NaOH concentration of 50 wt. % and KOH concentration of 50 wt. %. Partial stripping was observed after 1 h, slower stripping rate compared to compared to chemical stripping processes in which a NaOH 50 wt. % concentration was used.

Step III of Example 10

IIIe. Base/salt mixture of NaOH:NaCl in molar rate 1:1 was used in a saturated aqueous solution having NaOH concentration of 50 wt. % and NaCl concentration of 25 wt. %. Partial stripping was observed after 20 min, slower stripping rate compared to compared to chemical stripping processes in which a NaOH 50 wt. % concentration was used.

IIIc. Base/salt mixture of KOH:NaCl in molar rate 1:1 was used in a saturated aqueous solution having KOH concentration of 50 wt. % and NaCl concentration of 25 wt. %. Partial stripping was observed, slower stripping rate compared to compared to chemical stripping processes in which a NaOH 50 wt. % concentration was used.

Methods according to the present invention have been also successfully used for decoating of substrates coated with many different kind of coatings, e.g. TiAlN-, TiAlSiN-, TiAlN-based and TiAlSiN-based coatings, amongst others.

The aqueous solution can be agitated or the substrates being decoated can be moved during chemical stripping process. The method according to the present invention can also comprise further pre-treatment or post-treatment steps, e.g. rinsing, cleaning, ultrasound bad treatments, drying and heat treatments, amongst others.

Independent protection, too, is claimed for a system of tools with a renewable coating characterized in that the system is constituted by coated tools that carry—directly on its surface to be stripped for recoating— a coating comprising aluminium and that is constituted and by a stripping agent in the shape of an aqueous alkaline solution that comprises NaOH in a concentration in weight percentage from 30 wt. % to 50 wt. %.

The invention claimed is:
1. A method for stripping a coating from a coated surface of a substrate, wherein the coating is stripped in an aqueous alkaline solution, the method comprising the following steps:
preparing the coated substrate to be decoated by providing the substrate with a strippable coating by depositing a coating comprising one or more layers, wherein one layer comprising aluminum is deposited directly on the substrate surface to be decoated; and
introducing the substrate to be decoated in the aqueous alkaline solution, thereby conducting a chemical stripping of the coating from the substrate, wherein the aqueous alkaline solution comprises NaOH in a concentration in weight percentage from 30 wt. % to 50 wt. %, and wherein the substrate is connected to a sacrificial anode for conducting the chemical stripping process, and the material of the sacrificial anode is selected having lower electrochemical potential than the material of the substrate to be decoated, or having lower electrochemical potential than material constituents contained in the substrate to be decoated that can be dissolved during chemical stripping.

2. The method according to claim 1, wherein the layer deposited directly on the substrate surface to be decoated is selected from the group consisting of: a metallic interlayer layer, a wurtzite aluminum nitride layer, a layer comprising wurtzite aluminum nitride, and an aluminum oxide layer.

3. The method according to claim 1, wherein the chemical stripping is conducted by maintaining the aqueous alkaline solution at a temperature corresponding to a value in a range from 80° C. to 160° C., the temperature range including border values 80° C. and 160° C., respectively.

4. The method according to claim 3, wherein the temperature of the aqueous alkaline solution is a value in a range from 100° C. to 140° C., the range including border values 100° C. and 140° C., respectively.

5. The method according to claim 1, wherein the concentration of NaOH in the aqueous alkaline solution is in a concentration range from 40 wt. % to 50 wt. %, the concentration range including border values 40 wt. % and 50 wt. %, respectively.

6. The method according to claim 1, wherein the sacrificial anode is made of iron or is made of a material comprising iron.

7. The method according to claim 6, wherein the substrate is made of cemented carbide having a cobalt binder phase or the substrate to be decoated is made of a material comprising cemented carbide having a cobalt binder phase.

8. The method according to claim 1, wherein the substrate to be decoated is made of cemented carbide or the substrate is made of a material comprising cemented carbide.

9. A method for stripping a coating from a coated surface of a substrate, wherein the coating is stripped in an aqueous alkaline solution, the method comprising the following steps:
preparing the coated substrate to be decoated by providing the substrate with a strippable coating by depositing a coating comprising one or more layers, wherein one layer comprising aluminum is deposited directly on the substrate surface to be decoated using a physical vapor deposition process, and before conducting the deposition process a blasting media comprising alumina is used for blasting one or more cathodes that are used as a coating material source for depositing said layer directly on the substrate; and
introducing the substrate to be decoated in the aqueous alkaline solution, thereby conducting a chemical stripping of the coating from the substrate, wherein the aqueous alkaline solution comprises NaOH in a concentration in weight percentage from 30 wt. % to 50 wt. %.

* * * * *